United States Patent [19]

Ihara et al.

[11] Patent Number: 5,482,569
[45] Date of Patent: Jan. 9, 1996

[54] ROOF FOR GENERATING ELECTRICITY BY SOLAR LIGHT

[75] Inventors: Takuro Ihara, Kawasaki; Osamu Ishikawa, Tokyo, both of Japan

[73] Assignees: Fuji Electric Co., Ltd., Kanagawa; Misawa Homes Co., Ltd., Tokyo, both of Japan

[21] Appl. No.: 280,882

[22] Filed: Jul. 27, 1994

[30] Foreign Application Priority Data

Jul. 28, 1993 [JP] Japan ................................ 5-185665

[51] Int. Cl.⁶ .................... E04D 13/18; H01L 31/045; H01L 31/05; H01L 31/048
[52] U.S. Cl. .................... 136/251; 136/244; 136/245; 136/291; 52/173.3
[58] Field of Search ............................. 136/244, 245, 136/251, 291; 52/173.3

[56] References Cited

U.S. PATENT DOCUMENTS

| 4,860,509 | 8/1989 | Laaly et al. | 52/173.3 |
| 5,112,408 | 5/1992 | Melchior | 136/251 |
| 5,164,020 | 11/1992 | Wagner et al. | 136/251 |

FOREIGN PATENT DOCUMENTS

| 5-5344 | 1/1993 | Japan | 136/251 |

*Primary Examiner*—Aaron Weisstuch
*Attorney, Agent, or Firm*—Finnegan, Henderson, Farabow, Garrett & Dunner

[57] ABSTRACT

A base member for a roof is composed of a flexible high molecular material film and thin film solar cell modules formed thereon, and a finish member placed on the base member is a tile made of reinforced glass. The solar cell modules of 280 V output are sequentially formed with gaps on a long roll-shaped flexible film substrate and the substrate is cut in accordance with the size of the roof at the gaps between adjacent modules and placed on the roof board. The output terminals exposed at the cut gap portion are connected to each other or to an inverter.

12 Claims, 2 Drawing Sheets

ROOF FOR GENERATING ELECTRICITY BY SOLAR LIGHT

BACKGROUND OF THE INVENTION

The present invention relates to a roof for generating electricity by solar light, which is placed on an upper portion of a house or the like and is capable of generating electric power.

There is great expectations for solar cells as a clean source of energy. Since the quantity of electric power generated by a solar cell is proportional to the area of the solar cell, a large area for placement of the solar cell is required to generate a large quantity of electric power. For such a location, it is suitable to use an upper portion of a house, especially a slant tiled roof of a house or the like having few other applications and also from the viewpoint that the roof is positioned near the point of electric power consumption.

The simplest way of placing the solar cell on the roof of a house or the like, is such that a mounting base is fixed to a roof structure member by metal fittings or the like over roof tiles and a module composed of a plurality of solar cells is set on the mount base. However, in this case, the mounting base and the module are structures independent from the roof and there arise problems that the roof is required to have great strength and the mounting base and solar cell module spoil the appearance of the house.

Thus, a solar cell tile has been developed as a substitute for the above described tile. The solar cell tile is produced by directly forming a solar cell element on a tile base material or by embedding a solar cell element on or in a tile base material.

However, such a solar cell tile has great problems in terms of practical use in that not only is it very expensive but the placement operation is very troublesome. That is, two positive and negative output terminals are provided to the respective solar cell tiles, and during the placement of the tiles, the output terminals must be suitably connected in parallel or in series to each other without interrupting the surface of the solar cell, which is an extremely troublesome wiring operation which makes the installation cost very high.

SUMMARY OF THE INVENTION

An object of the present invention is to solve the above problems and to provide a roof for generating electricity by solar light which is easily constructed and has a low cost.

In order to achieve the above objects, a roof for generating electricity by solar light according to the present invention comprises a flexible base member and a roof finish member fixed on the base member. The finish member is transparent and the base member comprises a flexible substrate and thin film solar cells formed on the substrate. It is effective that the finish member is a tile made of a transparent material. Also, it is preferable that the surface of the thin film solar cell on the base member is covered with a surface protective layer at the side opposite to the flexible substrate. Further, it is suitable that the base member is cut from a long roll in which an output terminal conductor is exposed at a portion where cutting can be performed, and the output terminal conductors exposed at the respective cut portions of a plurality of base members are connected to each other, or a pair of output terminal conductors exposed at the cut portion of the under member are connected to an inverter.

A roof of a house or the like is generally formed by placing a roof finish member such as a tile on a waterproof flexible base member called a roofing material. When the base member composed of the thin film solar cells formed on the flexible substrate is used as the roofing material and the upper finish member is made transparent, it is not necessary to provide a base mounting and it becomes possible to generate electric power through the roof itself by the sunlight passing through the finish member. When the base member is prepared as a roll type long member so that a desired length can be cut out and an output terminal conductor is exposed at the cut portion, it is possible to arbitrarily connect the solar cells of the base member in series or parallel to each other by connecting the conductors to each other. It is also possible to connect the solar cell to an inverter by using the output terminal conductor.

DESCRIPTION OF THE PREFERRED EMBODIMENTS

Preferred embodiments of the present invention will be described with reference to the accompanying drawings.

Figure 1A:
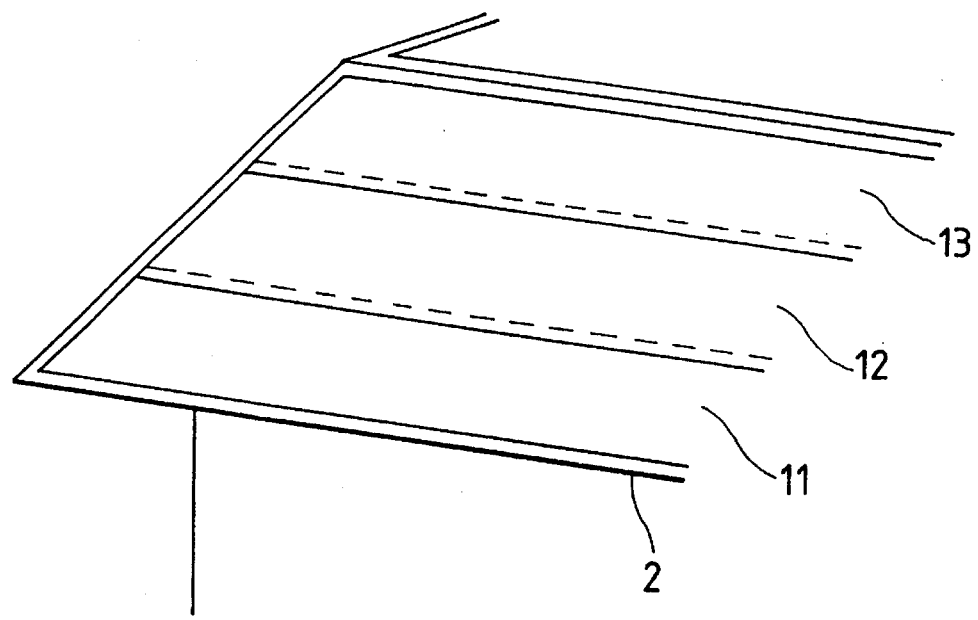
FIGS. 1(a) and 1(b) are perspective views showing the construction of a roof according to an embodiment of the present invention.
Figure 1B:
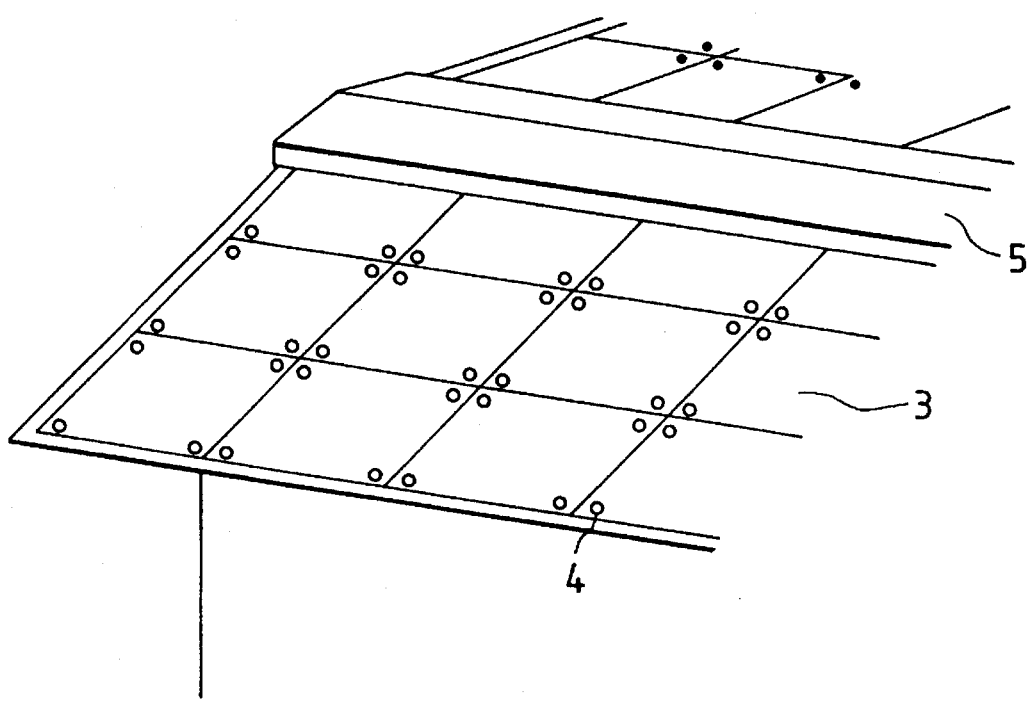

FIGS. 1(a) and 1(b) show the construction of a roof of a house according to an embodiment of the present invention. On a roof board 2, roof members 11, 12, and 13 including solar cell modules on the surface thereof are disposed from the eaves to the ridge in three columns with an overlap of 100 mm, and are fixed by tacks (FIG. 1(a)). Next, tiles 3 made of reinforced glass are placed on the roof members and are fixed in place by means of attachment members 4. Thereafter, hip portion 5 of the center ridge is further constructed (FIG. 1(b)).

Figure 2:
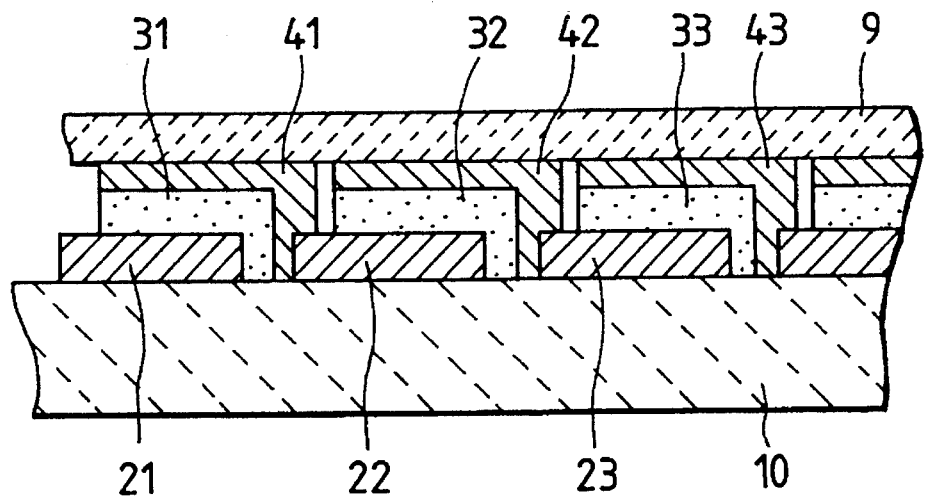
FIG. 2 is a sectional view showing a roof base member according to an embodiment of the present invention.

The roofing material used for the roof shown in FIG. 1 uses as a substrate a film 10, as shown in FIG. 2, made of a high molecular material such as polyether sulfone, aromatic polyamide, polyethylene terephthalate, polyethylene naphthalate, and polyimide. On the flexible substrate 10, an aluminum thin film with a thickness of 300 nm is formed by a sputtering method, and is patterned by photolithography to form strip-shaped rear side electrodes 21, 22, 23. Next, in a plasma CVD chamber, a mixed gas of $H_2$ and 10% $SiH_4$ of 1000 sccm, $C_2H_2$ of 5 sccm, and $B_2H_6$ of 1 sccm are inputted to form a p-layer of amorphous SiC with a thickness of 100 Å under a pressure of 0.1 Torr and a power density of 100 mW/cm$^2$, and a (10% $SiH_4+H_2$) gas of 1000 sccm and $C_2H_2$ of 5 sccm are inputted to form a buffer layer of amorphous SiC with a thickness of 100 Å under a pressure of 1.0 Torr and a power density of 100 mW/cm$^2$. Next, a 100% $SiH_4$ gas is inputted at a flow rate of 1000 sccm to form an i-layer of amorphous Si with a thickness of 3000 Å under a pressure of 0.5 Torr and a power density of 100 mW/cm$^2$, and a (10% $SiH_4+H_2$) gas of 1000 sccm and $PH_3$ of 4 sccm are inputted to form an n-layer of amorphous Si with a thickness of 300 Å under a pressure of 1.0 Torr and a power density of 100 mW/cm$^2$. Then, patterning is conducted using photolithography to form strip-shaped thin film semiconductor regions 31, 32, 33. Then, a transparent conductive material such as tin oxide, ITO, or ZnO is formed thereover as a film with a thickness of 2000 nm by a sputtering method and is patterned to form strip-shaped transparent electrodes 41, 42, 43. The respective unit cells constructed by the combination of the rear side electrode 21, the semiconductor thin film 31, and the transparent electrode 41, and the combination of the rear side electrode 22, the semiconductor thin film 32, and the transparent electrode 42, etc., are connected in series to each other.

Figure 3:
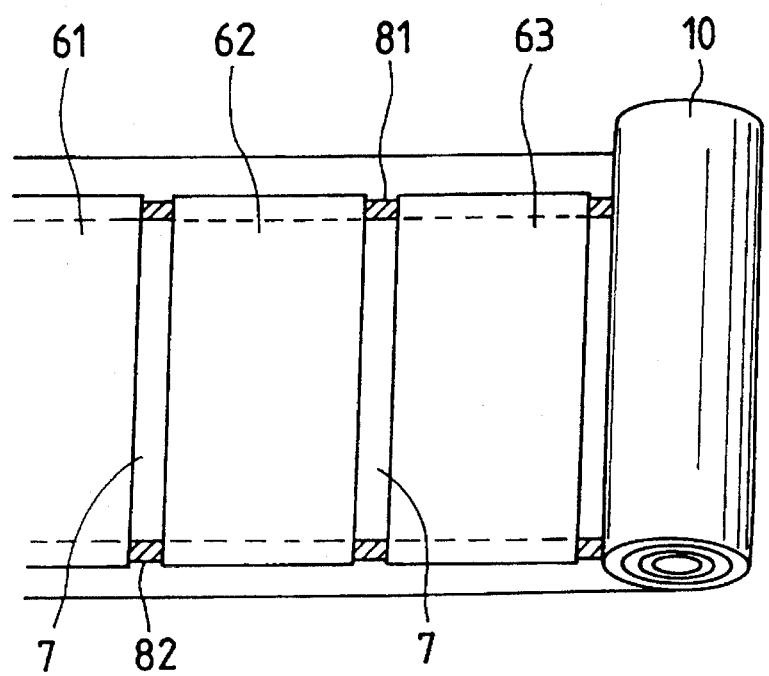
FIG. 3 is a perspective view showing a raw member of a roof base member according to an embodiment of the present invention.

On the roll-shaped long flexible substrate 10, as shown in FIG. 3, generation portions 61, 62, and 63 each composed of about 200 series-connected unit cells are formed with gaps 7, and positive terminal leads 81 and negative terminal leads 82 are exposed therebetween. In the respective generation portions 61, 62, and 63, unit cells are series-connected by a method shown in FIG. 2 in the width direction of the substrate 10, and also series-connected in the longitudinal direction of the substrate 10 so that a voltage of about 280 V, which is the most suitable voltage for a 200 V inverter, can be outputted from the positive terminal lead 81 and the negative terminal lead 82 from the respective generation portions. Further, a protective film 9 made of polyvinylfluoride with a thickness of 50 μm is provided, as shown in FIG. 2, to increase the waterproof property.

In order to put the thus formed roofing material on the roof as shown in FIG. 1, the substrate 10 is cut at the gap 7 in accordance with the size of the roof. At the position of the gap 7, at least one of the rear side electrode (21, 22, 23) and the transparent electrode (31, 32, 33) is removed, so that even if the substrate is cut by scissors, knife or the like, electric shortcircuit does not occur due to contact of the rear side electrode. At the gaps which are not cut, the respective generation portions 61, 62, and 63 are connected in parallel to each other by the leads 81 and 82. For the roofing materials 11, 12, and 13 placed on the roof board 2 as shown in FIG. 1, the positive terminal lead 81 and the negative terminal lead 82 exposed at the cut end are connected in parallel to each other by wiring. Then, the positive terminal lead 81 and the negative terminal lead 82 at the outermost ends are connected to an inverter so that the electric power generated by the sun light can be put into practical use.

According to the present invention, the flexible base member corresponding to the roofing material of a normal house is constructed by a flexible substrate including a solar cell module thereon, and the roof finish member corresponding to a tile is constructed by transparent glass. Thus, the roof of the present invention is superior in the unity of the solar cell module and the house. That is, it does not spoil the appearance of the house, contrary to the case where a base mounting is placed on the roof and the solar cell module is placed thereon, and the construction is easy. The flexible base member is composed of the flexible film substrate and the thin film solar cell modules formed into a roll, and the roll is cut in accordance with the size of the roof at one of the gaps previously provided with a predetermined distance between adjacent modules and the cut base member is placed on the roof. Accordingly, it is possible to place the solar cells on the roof by the same simple method as that of installing a normal paper roofing material.

Further, parallel connection of the solar cell modules of the base members placed on the roof is realized by wiring all terminal conductors exposed at the ends after mounting. Thus, the wiring operation is very easy as compared with the conventional solar cell roof tiles which require parallel/series connection every time a tile is installed.

What is claimed is:

1. A roofing material for covering a roof and for generating electricity by solar light, said roofing material comprising:
    flexible base members each composed of a flexible substrate and thin film solar cells formed thereon; and
    transparent roof finish members fixed to the flexible base members;
    wherein the base members are cut from a roll member in which output terminal conductors are exposed at gap portions for cutting the base members.

2. A roof for generating electricity by solar light as claimed in claim 1, wherein the finish members are roof tiles made of a transparent material.

3. A roof for generating electricity by solar light as claimed in claim 1, further comprising a surface protective layer covering the surfaces of the thin film solar cells at the side opposite to the flexible substrate of the base members.

4. A roof for generating electricity by solar light as claimed in claim 1, wherein the output terminal conductors exposed at the cut portions of the plurality of base members are connected to each other.

5. A roof for generating electricity by solar light as claimed in claim 1, wherein a pair of output terminal conductors exposed at the cut portions of the base members are connected to an inverter.

6. A roofing material for covering a roof and for generating electricity by solar light, said roofing material comprised of:
    a plurality of band-shaped flexible base members, each of said base members including a plurality of generation portions arranged in a lengthwise direction of said base member, and a positive terminal lead and a negative terminal lead electrically connecting successive generation portions, said plurality of generation portions defining gaps therebetween for cutting each flexible base member to a length corresponding to a length of said roof, said positive terminal lead and said negative terminal lead being exposed between successive generation portions.

7. The roofing material as claimed in claim 6, wherein an end of a positive terminal lead and an end of a negative terminal lead are exposed at a cut gap of each base member, the exposed positive terminal lead ends of said plurality of base members being electrically interconnected, and the exposed negative terminal lead ends of said plurality of base members being electrically interconnected.

8. The roofing material as claimed in claim 7, wherein said interconnected positive terminal lead ends and said interconnected negative terminal lead ends are connected to an inverter.

9. The roofing material as claimed in claim 6, wherein each of said generation portions includes a plurality of thin film solar cells connected in series.

10. The roofing material as claimed in claim 6, further comprising a plurality of transparent finish members disposed over said flexible base members.

11. The roofing material as claimed in claim 6, wherein each of said flexible base members overlaps an adjacent flexible base member.

12. The roofing material as claimed in claim 6, wherein a longitudinal edge of each of said flexible base members is laid on a longitudinal edge of a lower adjacent flexible base member to waterproof said roofing material.

* * * * *